(12) United States Patent
Jarek et al.

(10) Patent No.: US 8,557,504 B2
(45) Date of Patent: Oct. 15, 2013

(54) THERMALLY ABLATABLE LITHOGRAPHIC PRINTING PLATE PRECURSORS

(75) Inventors: Mathias Jarek, Northeim (DE); Domenico Balbinot, Osterode am Harz (DE)

(73) Assignee: Eastman Kodak Company, Rochester, NY (US)

( * ) Notice: Subject to any disclaimer, the term of this patent is extended or adjusted under 35 U.S.C. 154(b) by 357 days.

(21) Appl. No.: 12/818,441

(22) Filed: Jun. 18, 2010

(65) Prior Publication Data

US 2011/0311916 A1    Dec. 22, 2011

(51) Int. Cl.
*G03F 7/26* (2006.01)
*G03F 7/11* (2006.01)
*B41N 1/06* (2006.01)

(52) U.S. Cl.
USPC ...... 430/306; 430/271.1; 101/453; 101/463.1

(58) Field of Classification Search
USPC .............................. 430/271.1, 273.1, 300, 306
See application file for complete search history.

(56) References Cited

U.S. PATENT DOCUMENTS

| | | | |
|---|---|---|---|
| 5,493,971 A | 2/1996 | Lewis et al. | |
| 5,605,780 A | 2/1997 | Burberry et al. | |
| 5,633,118 A * | 5/1997 | Burberry et al. | 430/292 |
| 5,985,515 A | 11/1999 | Van Rompuy et al. | |
| 6,013,983 A * | 1/2000 | Asano et al. | 313/581 |
| 6,090,524 A | 7/2000 | Deboer et al. | |
| 6,186,067 B1 | 2/2001 | Rorke et al. | |
| 6,192,798 B1 | 2/2001 | Rorke et al. | |
| 6,242,156 B1 * | 6/2001 | Teng | 430/270.1 |
| 6,293,197 B1 * | 9/2001 | Ray et al. | 101/455 |
| 6,352,028 B1 | 3/2002 | Ellis | |
| 6,357,352 B1 | 3/2002 | Rorke et al. | |
| 6,490,975 B1 | 12/2002 | Rorke et al. | |
| 6,497,178 B1 | 12/2002 | Rorke et al. | |
| 6,632,584 B1 * | 10/2003 | Morgan | 430/271.1 |
| 6,632,589 B2 * | 10/2003 | Inno et al. | 430/303 |
| 2002/0124755 A1 | 9/2002 | Lewis | |
| 2002/0147111 A1 * | 10/2002 | Sun | 504/100 |
| 2008/0241738 A1 * | 10/2008 | Maemoto | 430/270.1 |

FOREIGN PATENT DOCUMENTS

| | | |
|---|---|---|
| EP | 0 580 393 | 1/1994 |
| EP | 0 678 380 | 10/1995 |
| EP | 1 088 653 | 4/2001 |

* cited by examiner

*Primary Examiner* — Anca Eoff
(74) *Attorney, Agent, or Firm* — J. Lanny Tucker

(57) ABSTRACT

A lithographic printing plate precursor can be used to prepare a printing plate using thermal ablation. The precursor has a non-thermally ablatable first layer on a substrate. Over the first layer is a thermally ablatable outer layer that includes an IR absorbing compound in an ablatable polymeric binder. The first layer includes a sol gel as a continuous inorganic matrix and a discontinuous inorganic phase (inorganic particles) dispersed therein.

9 Claims, No Drawings

US 8,557,504 B2

THERMALLY ABLATABLE LITHOGRAPHIC PRINTING PLATE PRECURSORS

FIELD OF THE INVENTION

This invention relates to thermally ablatable multi-layer lithographic printing plate precursors that can be imaged using thermal ablation such as by using a laser. This invention also relates to a method of providing lithographic printing plates using relatively low energy thermal ablation for imaging.

BACKGROUND OF THE INVENTION

Traditional techniques for introducing a printed image onto a recording material include letterpress printing, gravure printing, and offset lithography. All of these techniques require the preparation and use of a lithographic printing plate having an ink-receptive outer surface and a hydrophilic support or substrate. As used herein, the term "lithographic" is meant to include various terms used synonymously such as offset, offset lithographic, planographic, and others known in the art, and is meant to refer to type of lithographic printing plate where printing is based upon the immiscibility of oil and water, wherein the oily material or ink is preferentially retained by the image area and the water or fountain solution is preferentially retained by the non-image area. When the suitably prepared surface is contacted with fountain solution (or water) and a lithographic printing ink, the background or non-image areas retain the water and repel the ink while the image areas repel water and retain ink.

Aluminum has been used for many years as a substrate for lithographic printing plates and their precursors (before imaging). The aluminum substrate is usually treated in a number of ways to improve adhesion of the image areas and to provide desired hydrophilicity to the background of the image.

Some lithographic printing plate precursors are prepared by coating appropriate radiation-sensitive coatings onto the substrate, imaging with appropriate radiation, and developing with an alkaline processing solution to remove non-image areas.

Recent developments in the field of printing plate precursors concern the use of radiation-sensitive compositions that can be imaged by means of lasers or laser diodes, and more particularly, that can be imaged or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Other methods of preparing lithographic printing plates involve laser ablation systems in which organic materials in an imaging layer on the substrate are removed by high laser power. "Ablation" refers to the physical disruption and degradation of the organic materials, producing gases and organic debris.

A variety of laser ablation lithographic printing plate precursors are described in numerous literature publications including but not limited to, EP 580,393 (Lewis et al.) that describes a precursor having an IR-absorbing layer on a substrate, which layer is coated with a surface silicone layer that repels ink. Other embodiments include a hydrophilic poly (vinyl alcohol) surface layer. Still other precursors in this publication have only 1 or up to 3 layers on my substrate.

Still other laser-ablatable lithographic printing plate precursor constructions are described in EP 678,380 (Lewis et al.) and EP 1,088,653 (Rorke et al.), and U.S. Pat. No. 5,493,971 (Lewis et al.), U.S. Pat. No. 6,186,967 (Rorke et al.), U.S. Pat. No. 6,192,798 (Rorke et al.), U.S. Pat. No. 6,352,028 (Ellis), U.S. Pat. No. 6,357,352 (Rorke et al.), U.S. Pat. No. 6,489,975 (Rorke et al.), and U.S. Pat. No. 6,497,178 (Rorke et al.), and U.S. Published Patent Application 2002/0124755 (Lewis).

U.S. Pat. No. 5,605,780 (Burberry et al.) describes a laser-ablatable lithographic printing plate precursor that includes an image-forming layer comprising an infrared radiation absorbing agent dispersed within a film-forming poly(cyanoacrylate) binder.

In general, ablative imaging requires relatively high exposure energies, for example about 1000 $mJ/cm^2$, which means that customers need a unique high power imagesetter for imaging such precursors. Thus, the customers will need individual imagesetters for ablation and other imagesetters for the lower energy imaging techniques (non-ablation). This creates a need for additional equipment and energy costs, and training needs, for the customer. It would be desirable to use the same equipment for both laser-ablative and non-laser-ablative imaging.

SUMMARY OF THE INVENTION

This invention provides a thermally ablatable lithographic printing plate precursor comprising a substrate having thereon:

a non-thermally ablatable first layer disposed on the substrate, and an infrared radiation-absorptive and thermally ablatable outer layer disposed on the first layer, the outer layer comprising an infrared radiation absorbing compound dispersed within an organic binder, wherein the first layer is hydrophilic and composed of a discontinuous inorganic phase dispersed with a continuous inorganic sol gel phase.

In addition, this invention provides a method of providing a lithographic comprising:

A) imagewise exposing the thermally ablatable lithographic printing plate precursor of this invention by thermal ablation at an energy of at least 100 $mJ/cm^2$ and less than or including 1000 $mJ/cm^2$, and B) optionally removing ablation debris during the exposure step.

In some embodiments of this invention, the printing plate precursor of this invention consists essentially of the non-thermally ablatable first layer disposed on the substrate and the infrared radiation-absorptive and thermally ablatable outer layer. Thus, there are no other layers in the printing plate precursor that are necessary for imaging.

The present invention provides a lithographic printing plate precursor that can be thermally ablated at relatively lower energy compared to known thermally ablatable lithographic printing plate precursors. This allows the user of these precursors to image them using conventional image setters that are not commonly used for thermal ablation.

These advantages are achieved by using a unique composition for the underlayer located between the uppermost thermally ablatable layer and the substrate. This hydrophilic underlayer (also known herein as the "first layer") is composed of an inorganic discontinuous phase that is dispersed within a continuous phase that is composed of a condensation product of a sol gel. The sol gel provides a non-thermally ablatable matrix for the first layer and the inorganic discontinuous phase comprises particles that provide a measure of hydrophilicity for the first layer surface that repels ink and improves its adhesion to the thermally ablatable outer layer before imaging is carried out.

DETAILED DESCRIPTION OF THE INVENTION

The lithographic printing plate precursors can be used for the production of printing plates suitable or intended primarily for lithographic printing, letterpress printing, gravure printing, and screen printing.

Unless the context indicates otherwise, when used herein, the terms "lithographic printing plate precursor" and "printing plate precursor" are meant to be references to embodiments of the present invention.

In addition, unless the context indicates otherwise, the various components described herein such as "organic binder", "infrared radiation absorbing compound", "polymeric binder", and similar terms also refer to mixtures of such components. Thus, the use of the articles "a", "an", and "the" is not necessarily meant to refer to only a single component.

A "sol gel" as used in this invention refers to a reaction that is known in the art as a chemical synthesis of inorganic polymers such as glass or ceramics using a colloidal phase in solution. The basic chemistry and reaction conditions are well known as shown in the literature described in Columns 2 and 3 of U.S. Pat. No. 5,985,515 (Von Rompuy et al.). This reaction is generally composed of a series of hydrolysis steps in conjunction with polycondensation steps. During the growth reaction, a colloid phase with macromolecules in the nanometer range (sol) appear leading to a solid with a second phase within its pores. The sol-gel reaction can also be used to prepare inorganic-organic composite materials whereby reaction hydrolysis and polycondensation of a metal alkoxide species takes place under the influence of a suitable catalyst such as an acid, forming a matrix or network. As the network is built, alkoxymetal-substituted organic polymers or copolymers are also present in the reaction medium that also undergo the same polycondensation reaction as the hydrolyzed metal alkoxides and are incorporated into the matrix or network.

Moreover, unless otherwise indicated, percentages refer to percents by total dry weight, for example, weight % based on total solids of a specific layer or formulation. Unless otherwise indicated, the percentages can be the same for either the layer being described or the total solids of the formulation used to make the layer.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

The term "polymer" refers to high and low molecular weight polymers including oligomers, homopolymers, and copolymers, which are defined for this invention to have a molecular weight of at least 500.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

In the present invention, the image is generated in the image-forming, thermally ablatable outer layer by a process of thermal ablation such as laser-induced thermal ablation. In carrying out such process, a laser that emits in the infrared region (generally from about 700 nm to about 1400 nm) is used and the thermally ablatable outer layer must be sufficiently infrared radiation absorptive to bring about imagewise-generation of heat sufficient to completely remove the exposed regions by thermal ablation. This use of a laser renders it possible to obtain a high degree of image resolution needed for lithographic printing plates using relatively low thermal energy.

The lithographic printing plate precursors of this invention have a suitable hydrophilic substrate that can be prepared from a suitable polymeric film or metal sheet (such as aluminum, copper, steel, and chromium sheet). In most embodiments, the substrate is an aluminum-containing substrate such as an anodized aluminum sheet. The substrates are generally provided initially as an electrochemically grained support having aluminum as the predominant component, and including supports of pure aluminum and aluminum alloys. Thus, the electrochemically grained metal support can be composed of pure aluminum, aluminum alloys having small amounts (up to 10% by weight) of other elements such as manganese, silicon, iron, titanium, copper, magnesium, chromium, zinc, bismuth, nickel, or zirconium, or be polymeric films or papers on which a pure aluminum or aluminum alloy sheet is laminated or deposited (for example, a laminate of an aluminum sheet and a polyester film).

The thickness of the resulting aluminum-containing substrate can be varied but should be sufficient to sustain the wear from printing and thin enough to wrap around a printing form. Generally, support sheets have a thickness of from about 100 to about 700 μm.

The substrates can be prepared as continuous webs or coiled strips to provide substrates as continuous webs that can be cut into desired sheets at a later time.

The aluminum surface of the support is generally cleaned, roughened, and anodized using suitable known procedures. For example, the surface can be roughened (or grained) by known techniques, such as mechanical roughening, electrochemical roughening, or a combination thereof (multi-graining). Electrochemically graining can be carried out in a suitable manner as described for example in U.S. Pat. No. 7,049,048 (Hunter et al.). In some embodiments, the surface of the aluminum-containing support can be electrochemically grained using the procedure and chemistry described in U.S. Patent Application Publication 2008/0003411 (Hunter et al.).

While this electrochemically grained metal sheet can now be used as a substrate, it is usually subjected to additional treatments before such use. Generally, the electrochemically grained metal surface is etched with an alkaline solution to remove at least 100 mg/m$^2$, and typically to remove from about 100 to about 1000 mg/m$^2$. The electrochemically grained aluminum support can then be anodized in an alternating current passing through a sulfuric acid solution (5-30%) to form an oxide layer on the metal surface. When phosphoric acid is used for anodization, the conditions can be varied, as one skilled in the art would readily know.

The aluminum-containing support is then usually treated to provide a hydrophilic interlayer to render its surface more hydrophilic with, for example, a post-treatment solution containing a homopolymer of vinyl phosphonic acid (PVPA) or a vinyl phosphonic acid copolymer such as a copolymer derived from vinyl phosphonic acid and (meth)acrylic acid (that is either methacrylic acid, acrylic acid, or both). Other treatments are described in U.S. Pat. No. 7,416,831 (Hayashi et al.). Typically, the electrochemically grained, etched, and anodized aluminum support is treated with poly(vinyl phosphonic acid).

The backside (non-imaging side) of an aluminum substrate can be coated with antistatic agents and/or slipping layers or a matte layer to improve handling and "feel" of the imageable element.

The substrate can also be a cylindrical surface having the imageable layer thereon, and thus be an integral part of the printing press. The use of such imaging cylinders is described for example in U.S. Pat. No. 5,713,287 (Gelbart).

The non-thermally ablatable first layer that is disposed onto the substrate is hydrophilic in nature meaning that it attracts water or fountain solution more than it attracts a lithographic printing ink. This first layer also includes an inorganic sol gel phase that provides a continuous matrix for the layer in which particles and other components are dispersed. That this first layer is "non-thermally ablatable" means that it is not ablated during imaging to any significant extent, for example, less than 40 weight % of the layer is ablated. The first layer is adequately adhered to the substrate so that insignificant amounts of the first layer are removed during thermal ablative imaging.

The "inorganic sol gel phase" used in this invention is a homogeneous phase that is formed by the condensation reaction of a suitable aqueous solution or formulation of a hydrolyzable metal alkoxide including but not limited to, silicon alkoxide (silane), aluminum alkoxide, tin alkoxide, titanium alkoxide, zirconium alkoxide, magnesium alkoxide, zinc alkoxide, indium alkoxide, and combinations of multiple metal alkoxides. Di-, tri-, and tetra-alkoxy silanes, titanates, aluminates, zirconates, aluminates, and stannates are useful, and tetraalkoxy silane is particularly useful. Examples of such alkoxy silanes are TMEOS (tetramethylorthosilicate) and TEOS (tetraethylorthosilicate). Other useful sol gels can be obtained from hydroxides of the noted metals including but not limited to hydroxysilicon, and hydroxyaluminum, and hydroxytitanium. These colloids can be formed using the methods known in the art, including the teaching in U.S. Pat. No. 6,090,524 (DeBoer et al.) that is incorporated herein by reference. In addition, stable colloidal solutions can be purchased from a number of commercial sources.

Commercially available silicon dioxide particles include Aerodisp® W7520 (pH of 10) and Aerodisp® 7215S (pH of 4) that can be obtained as aqueous dispersions ready for use from Evonik (Germany).

The continuous inorganic sol gel phase is present in the first layer in an amount of from about 2 to about 99 weight %, or typically from about 5 to about 80 weight %, based on the total layer dry weight.

Within the inorganic sol gel phase are dispersed (unusually uniformly) inorganic particles that provide a discontinuous phase. These particles include but not limited to, particles of silicon dioxide, titanium dioxide, zinc oxide, or tin oxide particles. The particles in the discontinuous phase have an average particle size of from about 5 to about 500 nm in the largest dimension.

The discontinuous inorganic phase is present in the first layer in an amount of from about 1 to about 98 weight %, or typically from about 20 to about 85 weight %, based on the total layer dry weight.

The first layer can include optional components such as adhesion promoting compounds (such as phosphate- or phosphonate-containing silanes), hardeners, catalysts or crosslinking agents to harden the continuous matrix or hydrophilizing components such as polyethylene/polypropylene oxide silanes, but in most embodiments, these materials are not present and the first layer consists essentially of the inorganic sol gel and inorganic continuous matrix.

The first layer has a dry coating weight of at least 0.01 and up to and including 50 g/m$^2$. Typically, the dry coating weight is from 0.1 to 5 g/m$^2$. These coating weights typically provide a dry first layer thickness of from 0.1 to 5 µm.

The first layer can be applied to the substrate using any suitable technique include bar coating, hopper coating, spray coating, and coil coating, and upon application, the layer is dried for a suitable time and temperature.

Disposed on the non-thermally ablatable first layer is the infrared radiation-absorptive (IR-absorptive) and thermally ablatable outer layer ("outer layer"). There is no layer between these two layers.

The outer layer can be disposed on the first layer using any suitable technique including the same or different method used to provide the first layer on the substrate. In most instances, the outer layer is disposed on the first layer by solvent coating techniques.

Thus, the outer layer comprises one or more infrared radiation absorbing compounds dispersed (generally uniformly) within one or more organic binders. Such compounds are absorptive of radiation generally having a $\lambda_{max}$ of from 700 nm to 1400 nm, and more likely from 750 nm to 1250 nm. Useful infrared radiation absorbing compounds include but are not limited to, carbon blacks including conductive carbon blacks and surface-modified carbon blacks, and other IR-absorbing pigments and metal particles. Carbon blacks are particularly useful IR-absorbing pigments. Also useful are IR absorbing dyes and pigments that include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indoaniline dyes, merostyryl dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes and pigments are also described in numerous publications including U.S. Pat. No. 5,605,780 (Burberry et al.), U.S. Pat. No. 6,294,311 (noted above), U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), and U.S. Pat. No. 6,787,281 (Tao et al.), and EP 1,182,033A2 (noted above), all of which are incorporated herein by reference.

The infrared radiation absorbing compound is generally present in the outer layer in an amount of at least 2.5 weight % and up to and including 75 weight %, or typically from 5 to 65 weight %, based on the total dry outer layer weight.

The organic binders in the outer layer include one or more organic polymers that can be used to form continuous films before thermal ablation, and that have good mechanical and chemical resistance. Useful organic binders include but are not limited to, nitrocellulose, poly(cyanoacrylates), poly(meth)acrylates, novolaks, and resoles. The poly(cyanoacrylates) include homopolymers derived from a single cyanoacrylate monomer. The term "cyanoacrylate" includes alkylcyanoacrylate and alkoxycyanoacrylate in which the alkyl and alkoxy groups in the monomers have 1 to 10 carbon atoms, and can be linear, branched, or cyclic. These polymers also include copolymers derived from two or more different cyanoacrylate monomers that are polymerized to form polymer chains with randomly arranged units derived from combinations of monomers.

Examples of useful poly(cyanoacrylates) include but are not limited to, poly(ethyl-2-cyanoacrylate), poly(methyl-2-cyanoacrylate-co-ethyl-2-cyanoacrylate), poly(methyl-2-cyanoacrylate-co-ethyl-2-cyanoacrylate-co-propyl-2-cyanoacrylate), poly(methoxy-2-cyanoacrylate), and poly(methoxymethyl-2-cyanoacrylate).

Film-forming poly(cyanoacrylates) useful in this invention also include copolymers prepared by copolymerizing one or more cyanoacrylate monomers with one or more other ethylenically unsaturated polymerizable monomers as long as at least 50 mol % of the units in the copolymer are derived from cyanoacrylates. Such ethylenically unsaturated polymerizable monomers include but are not limited to, (meth)acrylates, (meth)acrylamides, vinyl ethers, butadienes, styrenes, and vinyl chloride.

The organic binders generally have an Mw of at least 10,000 and up to and including 1,000,000 with a range of from 50,000 to 500,000 more likely.

The organic binders are generally present in the outer layer in an amount of from 25 to 95 weight %, or typically from 35 to 95 weight %, based on the total outer layer dry weight.

The outer layer can include optional addenda such as colorants such as visible dyes, ultraviolet dyes, and non-IR absorbing pigments that are not soluble in lithographic printing inks.

A coating composition for the outer layer is generally prepared by combining the infrared radiation absorbing compound, one or more organic binders, and any optional addenda with a suitable solvent or mixture of solvents. The coating composition can be applied to provide a relatively thin layer and then dried to provide a coating coverage of at least 0.05 g/m$^2$ and up to and including 10 g/m$^2$. The dry outer layer has a thickness of at least 0.05 μm and up to and including 10 μm. More typically, the dry outer layer thickness is from about 0.2 to about 5 μm.

The dry thickness ratio of the outer layer to the first layer is generally from about 0.1:1 to about 1000:1, or typically from 0.1:1 to 10:1.

Lithographic printing plates are prepared from the lithographic printing plate precursors of this invention by imagewise thermal ablation of the thermal ablatable outer layer by directing suitable thermal radiation to the outer surface of the outer layer. In operation, imagewise pulses from the imaging laser interact with the thermally ablatable outer layer, causing ablation or disruption of the outer layer in the imaged regions. The imaging energies can be relatively low compared to other thermal ablative methods. Imaging is generally carried out at an energy of at least 100 mJ/cm$^2$ and less than or including 1000 mJ/cm$^2$, or more likely from 300 to 600 mJ/cm$^2$, to provide a clear background using a suitable imaging apparatus (for example as described in the Invention Examples below). Other suitable imaging apparatus include but are not limited to, Kodak® Quantum 800 imagesetters, Kodak® Magnus 400 imagesetters, Screen Flatrite 1050 PFR B2 imaging apparatus, Fuji Luxel CTP VX 9600 imaging machine, Heidelberg Prosetter 52 imager, and Luescher XPose! 160 machine.

The laser used to image the lithographic printing plate precursor is usually a diode laser, because of the reliability and low maintenance of diode laser systems, but other lasers such as gas or solid-state lasers can also be used. The combination of power, intensity and exposure time for laser imaging would be readily apparent to one skilled in the art. The laser output can be directed to the printing plate precursor surface using suitable lenses or other beam-guiding components, or be transmitted from a remote site using a fiber optic cable.

The imaging process then causes the materials in the outer layer to be ejected or disrupted from the printing plate precursor, thereby revealing the underlying first layer. The removed or ablated debris of the outer layer can be suitably removed using vacuum (for example with a vacuum device in close vicinity to the imaging or exposing device), brushes, dry or moist rags, or combinations of these procedures. For example, the debris can be cleaned off using water, fountain solution, another solvent, or a cleaning solution as described for example in EP 1,088,653 (Rorke et al.).

The resulting lithographic printing plate can be placed on a suitable printing press and appropriately inked using a lithographic printing ink for printing operations. If desired, the lithographic printing plate can be cleaned between operations.

The present invention provides at least the following embodiments and combinations thereof, but other combinations of features are considered to be within the present invention as a skilled artisan would appreciate from the teaching of this disclosure:

1. A thermally ablatable lithographic printing plate precursor comprising a substrate having thereon:

a non-thermally ablatable first layer disposed on the substrate, and an infrared radiation-absorptive and thermally ablatable outer layer disposed on the first layer, the outer layer comprising an infrared radiation absorbing compound dispersed within an organic binder, wherein the first layer is hydrophilic and composed of a discontinuous inorganic phase dispersed with a continuous inorganic sol gel phase.

2. The precursor of embodiment 1 wherein the discontinuous inorganic phase comprises silicon dioxide, titanium dioxide, zinc oxide, or tin oxide particles having an average particle size of from about 5 to about 500 nm.

3. The precursor of embodiment 1 or 2 wherein the continuous inorganic sol gel phase is a condensation product of a hydrolyzable metal alkoxide.

4. The precursor of any of embodiments 1 to 3 wherein the continuous inorganic sol gel phase is a condensation product of a hydrolyzable silane, aluminum alkoxide, tin alkoxide, or titanium alkoxide.

5. The precursor of any of embodiments 1 to 4 wherein the continuous inorganic sol gel phase is a condensation product of a hydrolyzable silane.

6. The precursor of any of embodiments 1 to 5 wherein the continuous inorganic sol gel phase is a condensation product of a hydrolyzable tetraalkoxy silane.

7. The precursor of any of embodiments 1 to 6 wherein the continuous inorganic sol gel phase is present in the first layer in an amount of from about 2 to about 99 weight %.

8. The precursor of any of embodiments 1 to 7 wherein the discontinuous inorganic phase is present in the first layer in an amount of from about 1 to about 98 weight %.

9. The precursor of any of embodiments 1 to 8 wherein the thermally ablatable outer layer comprises carbon black as the infrared radiation absorbing compound.

10. The precursor of any of embodiments 1 to 9 wherein the infrared radiation absorbing compound is present in the thermally ablatable outer layer in an amount of from about 2.5 to about 75 weight % based on the total thermally ablatable outer layer dry weight.

11. The precursor of any of embodiments 1 to 10 wherein the outer layer comprises nitrocellulose, a poly(cyanoacrylate), a poly(meth)acrylate, a novolak, or a resole as the organic binder.

12. The precursor of any of embodiments 1 to 11 wherein the dry thickness ratio of the thermally ablatable outer layer to the first layer is from about 0.1:1 to about 1000:1.

13. The precursor of any of embodiments 1 to 12 wherein the substrate is an aluminum-containing substrate.

14. The precursor of any of embodiments 1 to 13 that consists essentially of the non-thermally ablatable first layer disposed on the substrate and the infrared radiation-absorptive and thermally ablatable outer layer.

15. A method of providing a lithographic comprising:

A) imagewise exposing the thermally ablatable lithographic printing plate precursor of any of embodiments 1 to 14 by thermal ablation at an energy of at least 100 mJ/cm$^2$ and less than or including 1000 mJ/cm$^2$, and B) optionally removing ablation debris during the exposure step.

16. The method of embodiment 15 wherein step B is carried out using a vacuum unit placed in close vicinity of a device used for imagewise exposing.

The following Examples are intended to illustrate the present invention and are not meant to be limiting in any manner.

EXAMPLES

Two aqueous particle solutions, Aerodisp® W7520 (pH10) and Aerodisp® 7215S (pH 4) were selected for evaluations. Sodium silicate ("water glass" obtained from Sigma-Aldrich) and tetraethoxysilane ("TES" obtained from Sigma-Aldrich) were chosen for each particle solution. The solid composition contained about 25 wt. % of silicate and 75 wt. % of the silicon dioxide sol gel particles.

Sublayer I containing Aerodisp® 7215 with TES:

Dimineralized water (5.60 g) was mixed with 16.00 g of Aerodisp® W7520 (Evonik). Tetraethoxysilane (TES, 1 g) was added. The resulting solution was coated with a bar coater using a standard grained and anodized aluminum offset printing plate substrate with a coating weight of 1.00 g/m$^2$ and was dried for 10 minutes at 120° C.

Sublayer II containing Aerodisp® 7520 with Na$_2$SiO$_3$:

Dimineralized water (9.60 g) was mixed with 12.00 g of Aerodisp® W7520 (Evonik). "Water glass" (sodium silicate solution, 2.4 g) was added. The resulting solution was coated with a bar coater using the grained and anodized aluminum substrate described above with a coating weight of 1.00 g/m$^2$ and was dried for 10 minutes at 120° C.

Ablative Top Layer I: Nitrocellulose with carbon black:

The carbon black dispersion (13.21 g) described below and 2.58 g of nitrocellulose E950 (obtained from Walsrode) were dissolved in 67.37 g of Dowanol PM and 16.84 g methyl ether ketone (MEK). The resulting solution was coated with a bar coater to a 1.0 g/m$^2$ coating weight and dried for 5 minutes at 80° C.

Ablative Top Layer II: Poly(cyanoacrylate) with carbon black:

The carbon black dispersion (13.21 g) and 2.58 g of poly(ethyl-2-cyanoacrylate) were dissolved in 67.37 g of Dioxolane and 16.84 g of MEK. The resulting solution was coated with bar coater to 1.0 g/m$^2$ coating weight and dried for 5 minutes at 80° C. The poly(ethyl-2-cyanoacrylate) was obtained from Eastman Kodak Company.

Ablative Top Layer III: Poly(cyanoacrylate) with cyanine IR dye:

The cyanine IR dye, (2-[2-[2-chloro-3-[2-(1,3-dihydro-1,1,3-trimethyl-2H-benzo[e]-indol-2-ylidene)-ethylidene]-1-cyclohexen-1-yl]-ethenyl]-1,1,3-trimethyl-1H-benzo[e]indolium 4-methylbenzenesulfonate) and 2.58 g of poly(ethyl-2-cyanoacrylate) (obtained from Eastman Kodak Company, 1.26 g) was dissolved in 67.37 g of Dioxolane and 16.84 g of MEK. The resulting solution was coated with bar coater to 1.0 g/m$^2$ coating weight and dried for 5 minutes at 80° C.

Carbon Black Dispersion:

Printex L6 (Evonik, 10 g) and 90.0 g of nitrocellulose E950 were mixed with Dowanol PM and the concentration was adjusted to 14 wt, % solids. Byk® 307 (Byk Chemie, 0.25 g) was added. This suspension was treated for 4 hours in a ball mill with 2 mm glass spheres. The dispersion was then decanted off and stored in a glass bottle.

Coatings of each formulation were applied to the standard grained and anodized aluminum substrate described above to provide a dry sublayer coating weight of about 1.0 g/m$^2$ and was then cured for 10 minutes at 120° C. From micrographs of the coatings, we determined that the particulate size in the coated layers was found to be equal or less than 70 nm.

Imagewise Exposure:

The exposure energies (TABLE I) were measured on printing plate precursors having Top Layer I and Sublayer I or Sublayer II. The resulting lithographic printing plates were exposed by laser ablation using a Kodak® Quantum 800. The results are shown in TABLE I below.

TABLE I

|  | Clear Background | Linear Point (TE =0) |
|---|---|---|
| Sublayer I | 300 mJ/cm$^2$ | 400 mJ/cm$^2$ |
| Sublayer II | 400 mJ/cm$^2$ | 500 mJ/cm$^2$ |

The noted exposure energies are unexpectedly low for thermal ablative plates. Normally, much higher exposure energies around 1000-2000 mJ/cm$^2$ are required for laser ablation that means that customers need to have a high power image setter. The low exposure energy requirements of the lithographic printing plate precursors of this invention can allow the users to continue using their existing standard (low energy) imagesetters such as the commercially available Kodak® Quantum 800 and Kodak® Magnus 400. Thus, such equipment can be used for more types of lithographic printing plate precursors, both ablative and non-ablative.

Lithographic printing plate precursors prepared with the ablative Top Layer I and Sublayer I were exposed on a Kodak® Quantum 800 with 400 mJ/cm$^2$ and then used on a printing press (Roland Favorit). Cleaning out (development) on press was accomplished using 5 cycles of dampening and 5 cycles of inking. The resulting printed sheets showed a clear background from the first impression. Mechanical wear was not observed up to a run length of 50,000 impressions.

The invention has been described in detail with particular reference to certain preferred embodiments thereof, but it will be understood that variations and modifications can be effected within the spirit and scope of the invention.

The invention claimed is:

1. A method of providing a lithographic printing plate comprising:
    A) imagewise exposing a thermally ablatable lithographic printing plate precursor by thermal ablation at an energy of at least 100 mJ/cm$^2$ and less than or including 1000 mJ/cm$^2$, to cause the materials in an infrared radiation-absorptive and thermally ablatable outer layer to be ejected or disrupted from the lithographic printing plate precursor, thereby revealing an underlying non-thermally ablatable first layer and
    B) optionally removing ablation debris during the exposure step,
        wherein the thermally ablatable lithographic printing plate precursor consists essentially of a hydrophilic substrate having thereon:
        the non-thermally ablatable first layer disposed on the hydrophilic substrate, and
        the infrared radiation-absorptive and thermally ablatable outer layer disposed on the first layer, the infrared radiation-absorptive and thermally ablatable outer layer consisting essentially of an infrared radiation absorbing compound dispersed within a thermally ablatable organic binder, and
        the non-thermally ablatable first layer is hydrophilic and composed of a discontinuous inorganic phase dispersed within a continuous inorganic sol gel phase.

2. The method of claim 1, wherein the discontinuous inorganic phase comprises silicon dioxide, titanium dioxide, zinc oxide, or tin oxide particles having an average particle size of from about 5 to about 500 nm.

3. The method of claim 1, wherein the continuous inorganic sol gel phase is a condensation product of a hydrolyzable metal alkoxide.

4. The method of claim 1, wherein the continuous inorganic sol gel phase is a condensation product of a hydrolyzable silane, aluminum alkoxide, tin alkoxide, or titanium alkoxide.

5. The method of claim 1, wherein the continuous inorganic sol gel phase is present in the first layer in an amount of from about 2 to about 99 weight %, and the discontinuous inorganic phase is present in the first layer in an amount of from about 1 to about 98 weight %.

6. The method of claim 1, wherein the infrared radiation-absorptive and thermally ablatable outer layer comprises carbon black as the infrared radiation absorbing compound.

7. The method of claim 1, wherein the infrared radiation-absorptive and thermally ablatable outer layer comprises nitrocellulose, a poly(cyanoacrylate), a poly(meth)acrylate, a novolak, or a resole as the thermally ablatable organic binder.

8. The method of claim 1, wherein the dry thickness ratio of the infrared radiation-absorptive and thermally ablatable outer layer to the non-thermally ablatable first layer is from about 0.1:1 to about 1000:1.

9. The method of claim 1, wherein the dry thickness of the infrared radiation-absorptive and thermally ablatable layer is from about 0.1 µm to about 5 µm.

* * * * *